(12) United States Patent
Kim et al.

(10) Patent No.: US 6,284,996 B1
(45) Date of Patent: Sep. 4, 2001

(54) METHOD FOR MOUNTING INTEGRATED CIRCUITS ON PRINTED CIRCUIT BOARDS

(75) Inventors: Choul-Su Kim, Kyonggi-do; Woo-Sik Kim, Suwon; Byung-Woo Woo, Suwon; Masaharu Tsukue, Suwon, all of (KR)

(73) Assignee: SamSung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/124,678

(22) Filed: Jul. 30, 1998

(30) Foreign Application Priority Data

Aug. 1, 1997 (KR) .................................................. 97-36816

(51) Int. Cl.$^7$ ............................. B23K 1/00; B23K 31/02; B23K 31/00
(52) U.S. Cl. ...................... 219/85.13; 228/175; 228/178; 228/180.22
(58) Field of Search .............................. 228/180.22, 178, 228/175; 219/85.3

(56) References Cited

U.S. PATENT DOCUMENTS

| | | | |
|---|---|---|---|
| 3,777,221 | * 12/1973 | Tatusko et al. ................ 317/101 CP |
| 4,632,294 | * 12/1986 | Druschel et al. .................... 228/119 |
| 4,899,920 | * 2/1990 | Abbagnaro et al. ................... 228/11 |
| 4,972,990 | * 11/1990 | Abbagnaro et al. ................... 228/20 |
| 5,175,410 | 12/1992 | Freedman et al. . |
| 5,373,985 | * 12/1994 | Chiba et al. ...................... 228/180.1 |
| 5,425,495 | 6/1995 | Gibson . |
| 5,441,194 | * 8/1995 | Nishimura et al. ................... 228/6.2 |
| 5,646,441 | 7/1997 | Hasan et al. . |
| 5,704,116 | 1/1998 | Gamota et al. . |
| 5,729,051 | 3/1998 | Nakamura . |
| 5,872,051 | * 2/1999 | Fallon et al. ......................... 438/616 |

* cited by examiner

*Primary Examiner*—Tom Dunn
*Assistant Examiner*—Zidia Pittman
(74) *Attorney, Agent, or Firm*—Robert E. Bushnell, Esq.

(57) ABSTRACT

An improved method for mounting tape carrier package type integrated circuits on printed circuit boards. In the method, some of leads of the integrated circuit are preliminarily soldered with corresponding lead pattern on the printed circuit board after the integrated circuit is aligned on the printed circuit board so that the integrated circuit is prevented from being disordered while the printed circuit board including the integrated circuit aligned thereon is transferred to a soldering apparatus.

18 Claims, 4 Drawing Sheets

METHOD FOR MOUNTING INTEGRATED CIRCUITS ON PRINTED CIRCUIT BOARDS

CLAIM OF PRIORITY

This application makes reference to, incorporates the same herein, and claims all benefits accruing under 35 U.S.C. §119 from an application entitled Method for Mounting Integrated Circuits on Printed Circuit Boards earlier filed in the Korean Industrial Property Office on the 1st day of August 1997, and there duly assigned Serial No. 97-36816, a copy of which is annexed hereto.

BACKGROUND OF THE INVENTION

1. Technical Field

The present invention relates to a method for mounting integrated circuits on a printed circuit board and, more particularly to a method for mounting tape carrier package type integrated circuits on a printed circuit board.

2. Related Art

Computer systems are information handling systems that are utilized by many individuals and businesses today. A conventional computer system can be defined as a microcomputer that includes a central processing unit (CPU), a volatile memory, a non-volatile memory, a display monitor, a keyboard, a mouse, a floppy diskette drive, a compact disc-read only memory (CD-ROM) drive, a modem, a hard disk storage device, and a printer. Typically, a computer system's main board, which is a printed circuit board known as a motherboard, is used to electrically connect these components together.

The central processing unit is often described as a microprocessor. The microprocessor is an electronic component having internal logic circuitry handling most, if not all, the data processing in the computer system. The internal logic circuitry of microprocessors is typically divided into three functional parts known as the input/output (I/O) unit, the control unit, and the arithmetic-logic unit (ALU). These three functional parts interact together and determine the power and performance of the microprocessor. The combination of the control unit and the arithmetic-logic unit is sometimes referred to as the central processing unit. Also, the combination of the input/output unit, the control unit, and the arithmetic-logic unit is sometimes referred to as the central processing unit.

Microprocessors today are housed in packages that are thin, compact squares. Five common packaging types include the pin grid array (PGA), the multicavity module (MCM) pin grid array, the leadless chip carrier (LCC), the plastic quad flat package (PQFP), and the tape carrier package (TCP). The microprocessor must be mounted to the computer system's main board using a particular mounting procedure.

In general, the tape carrier package type of packaging for a microprocessor begins with a substrate of polyimide film laminated to copper foil. The copper foil is etched in order to form two contact patterns, a first contact pattern that will engage with tabs on the silicon chip of the microprocessor and a second contact pattern that will engage with the computer system's main board.

Consider a tape carrier package (TCP) type Pentium(R) microprocessor as an example of an integrated circuit (IC). The tape carrier package type Pentium(R) microprocessor is an extremely small component including 320 leads as input and output terminals. An interval between the leads is 0.25 millimeters. In addition, such a tape carrier package integrated circuit is relatively small because it does not include any wire-bonded portion that is usually included in other types of integrated circuit packaging. Accordingly, it is possible to fabricate smaller printed circuit boards (PCBS) using the tape carrier package type integrated circuits.

A conventional method for soldering and mounting the tape carrier package type integrated circuit on the printed circuit board (PCB) shall be described hereinafter. First, contaminating particles attached on the printed circuit board transferred from a previous process are removed by an air gun. A conductive bond is applied to predetermined portions of the aforementioned second contact pattern on the printed circuit board.

Thereafter, a flux is applied to the same portions of the second contact pattern on the printed circuit board that have been already applied with the conductive bond. The tape carrier package type integrated circuit that has been processed in a cutting and forming process is aligned with the second contact pattern applied with the flux. In other words, the aforementioned first contact pattern engaging with tabs on the silicon chip of the microprocessor is aligned with the second contact pattern applied with the flux.

A holding block is moved onto and covers the integrated circuit aligned on the printed circuit board. A light beam is applied to the integrated circuit to solder the integrated circuit on the printed circuit board. After the integrated circuit is soldered on the printed circuit board, the printed circuit board and the holding block are cooled.

However, since the steps of applying the flux, aligning the integrated circuit, and soldering the integrated circuit are carried out successively in one tool, a great amount of time is required for fabricating the printed circuit board. To overcome such a disadvantage, a method for mounting the integrated circuit on the printed circuit board in a shorter time has been provided. In the method, applying the flux to the printed circuit board and aligning the integrated circuit on the printed circuit board are carried out in a mounting apparatus, and soldering the integrated circuit on the printed circuit board is carried out in a soldering apparatus, separately.

However, the above method also suffers a disadvantage that the integrated circuit aligned on the printed circuit board may be disordered while the printed circuit board with the integrated circuit aligned thereon is transferred to the soldering apparatus.

Exemplars of recent efforts in the art include U.S. Pat. No. 5,704,116 for a Method of Holding a Component Using an Anhydride Fluxing Agent issued to Gamota et al., U.S. Pat. No. 5,425,495 for a Hot Air Circulation Method for Wave Soldering Machines issued to Gibson, U.S. Pat. No. 5,175,410 for an Ic Package Hold-down Fixture issued to Freedman et al., U.S. Pat. No. 5,646,441 for a Tcp Tab Design with Radial OuterLeads issued to Hasan et al., and U.S. Pat. No. 5,729,051 for a Tape Automated Bonding Type Semiconductor Device issued to Nakamura.

Although various integrated circuit mounting procedures currently exist, I have discovered that there is a need to provide an enhanced mounting procedure which can be utilized in order to mount an integrated circuit to a printed circuit board in an improved manner.

SUMMARY OF THE INVENTION

It is therefore an object of the present invention to provide an enhanced mounting procedure which can be utilized in order to mount an integrated circuit to a printed circuit board in an improved manner.

In addition, it is another object of the present invention to prevent integrated circuits applied with a flux and aligned on a printed circuit board from being disordered while the printed circuit board including the integrated circuits is transferred to a soldering apparatus by preliminarily soldering the integrated circuit on the printed circuit board before the printed circuit board with the integrated circuit aligned thereon is transferred to the soldering apparatus.

To achieve these and other objects in accordance with the principles of the present invention, as embodied and broadly described, the present invention provides a method for mounting integrated circuits on a printed circuit board according to the principles of the present invention comprising the steps of: applying a flux to an integrated circuit lead pattern on the printed circuit board; aligning leads of the integrated circuit formed through a cutting and forming step in a previous process on the lead pattern applied with the flux; preliminarily soldering some of the leads of the integrated circuit aligned on the printed circuit board with the lead pattern; completely soldering the integrated circuit that has been preliminarily soldered with the lead pattern on the printed circuit board by applying a light beam; and cooling the printed circuit board, wherein the preliminarily soldering step includes the steps of: moving down a hot air nozzle onto the leads of the integrated circuit aligned on the printed circuit board; spraying a hot air of a predetermined high temperature onto the leads of the integrated circuit for a predetermined amount of time; and stopping spraying the hot air and moving up the hot air nozzle.

Preferably, the hot air sprayed from the hot air nozzle may be formed by a heater. Preferably, the hot air has a temperature of 613 degrees Celsius and is sprayed onto the leads of the integrated circuit for approximately 3 seconds.

To achieve these and other objects in accordance with the principles of the present invention, as embodied and broadly described, the present invention provides a method of mounting an integrated circuit on a printed circuit board, comprising the steps of: applying a flux to an integrated circuit lead pattern on a printed circuit board; aligning a first plurality of leads of an integrated circuit with said lead pattern; first soldering a second plurality of leads of the integrated circuit with said integrated circuit lead pattern on the printed circuit board corresponding to the second plurality of leads, the second plurality of leads being selected from among the first plurality of leads, and said first soldering corresponding to a preliminary soldering; second soldering the first plurality of leads with said integrated circuit lead pattern on the printed circuit board by applying a beam of energy, and then cooling the printed circuit board; wherein said first soldering step comprises the substeps of: moving a hot gas nozzle toward the second plurality of leads of the integrated circuit aligned on the printed circuit board; spraying hot gas having a predetermined temperature from said hot gas nozzle to the second plurality of leads for a predetermined quantity of time; and stopping said spraying of hot gas and moving said hot gas nozzle away from the second plurality of leads.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

A preferred embodiment of a method for mounting integrated circuits on printed circuit boards according to the present invention will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
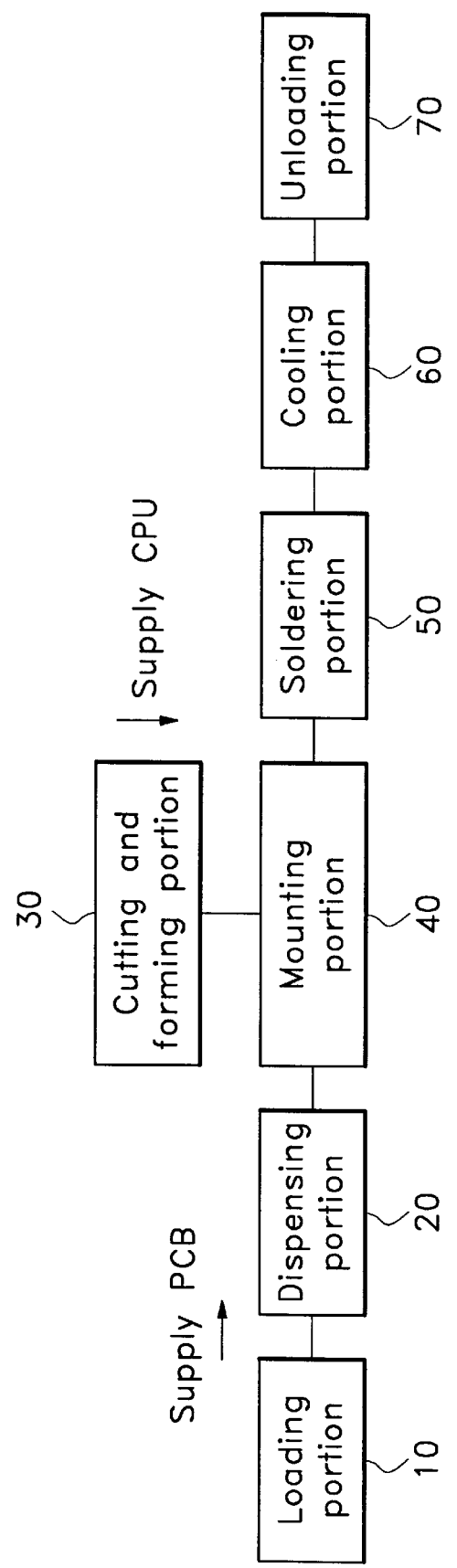
FIG. 1 is a block diagram of a mounting apparatus employing a method for mounting integrated circuits on a printed circuit board, in accordance with the principles of the present invention.

Turn now to FIG. 1, which is a block diagram of a mounting apparatus employing a method for mounting integrated circuits on a printed circuit board, in accordance with the principles of the present invention. Referring to FIG. 1, an integrated circuit mounting equipment employing the method for mounting integrated circuits on a printed circuit board according to the present invention mainly includes a mounting apparatus and a soldering apparatus.

The mounting apparatus includes: a loading portion 10 loading a printed circuit board array processed in a previous process on a processing position; a dispensing portion 20 applying a conductive bond to a portion on the printed circuit board that corresponds to a silicon chip of the integrated circuit; a cutting and forming portion 30 cutting the integrated circuit that is supplied loaded in a plastic carrier having a predetermined size and molding leads of the integrated circuits; and a mounting portion 40 applying a flux to an integrated circuit lead pattern on the printed circuit board that has been applied with the conductive bond thereto and aligning the leads of the integrated circuits with the integrated circuit pattern on the printed circuit board.

The soldering apparatus is separated from the mounting apparatus and includes: a soldering portion 50 soldering the integrated circuits on the printed circuit board by applying a xenon light beam to the integrated circuits on the printed circuit board; a cooling portion 60 cooling the soldered printed circuit board; and an unloading portion 70 unloading the printed circuit board cooled in the cooling portion 60.

Figure 2:
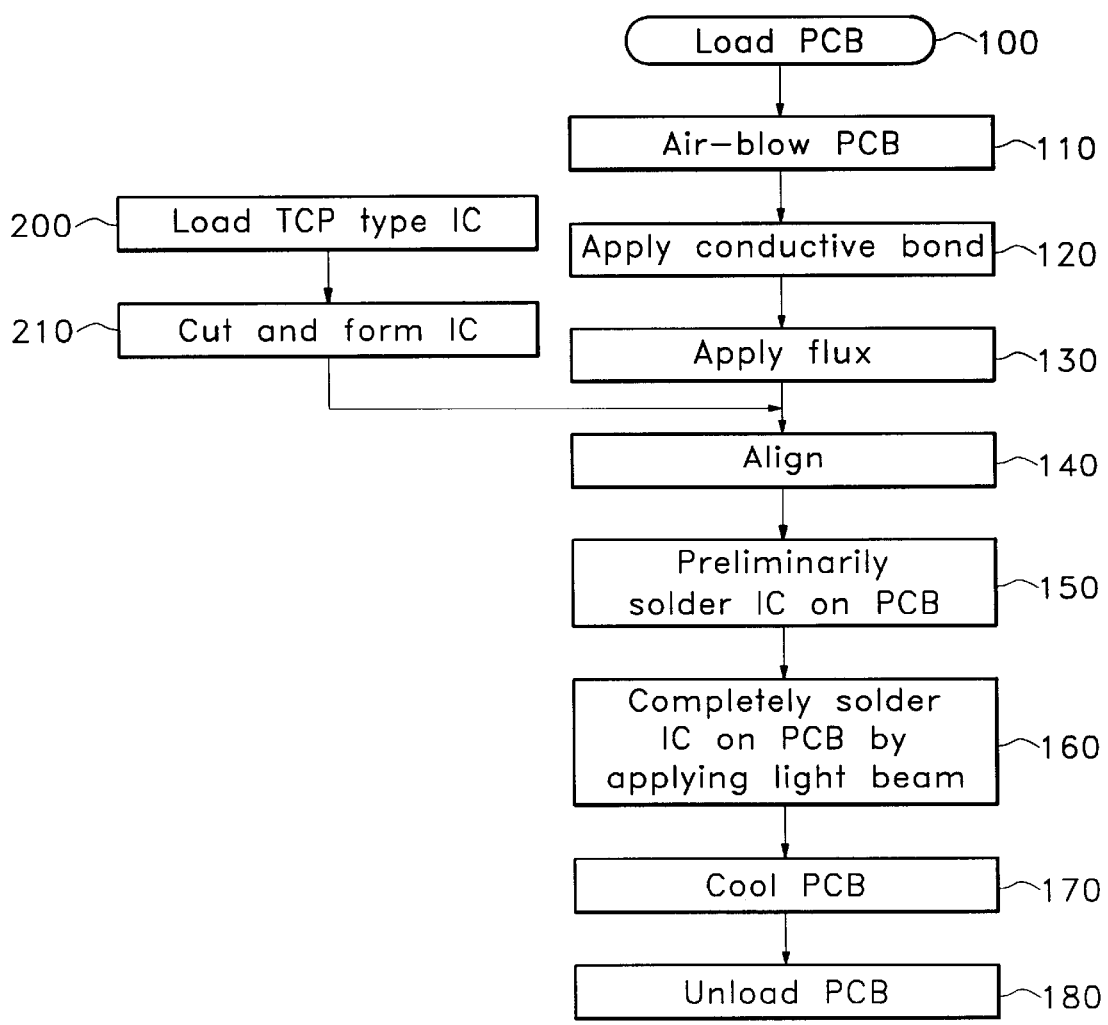
FIG. 2 is a flowchart of a method for mounting integrated circuits on a printed circuit board, in accordance with the principles of the present invention.
Figure 4A:
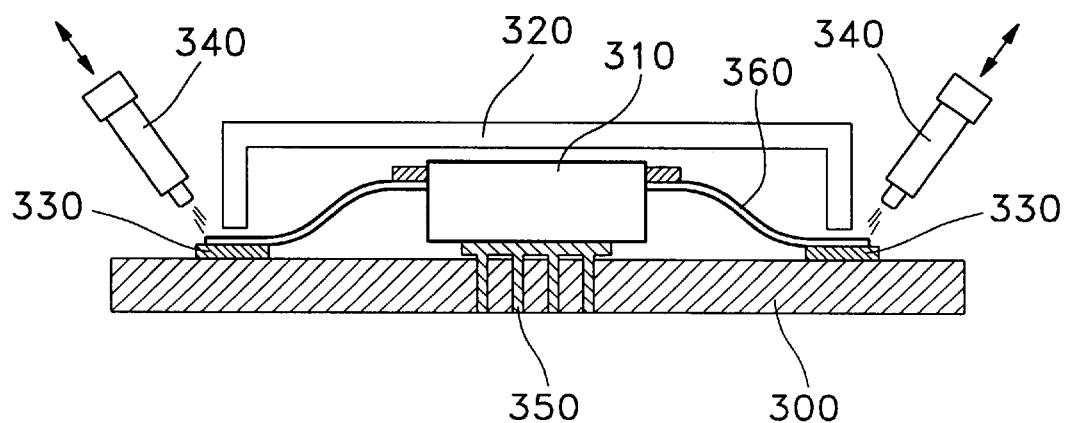
FIGS. 4A and 4B illustrate the method for mounting integrated circuits on a printed circuit board, in accordance with the principles of the present invention.
Figure 4B:
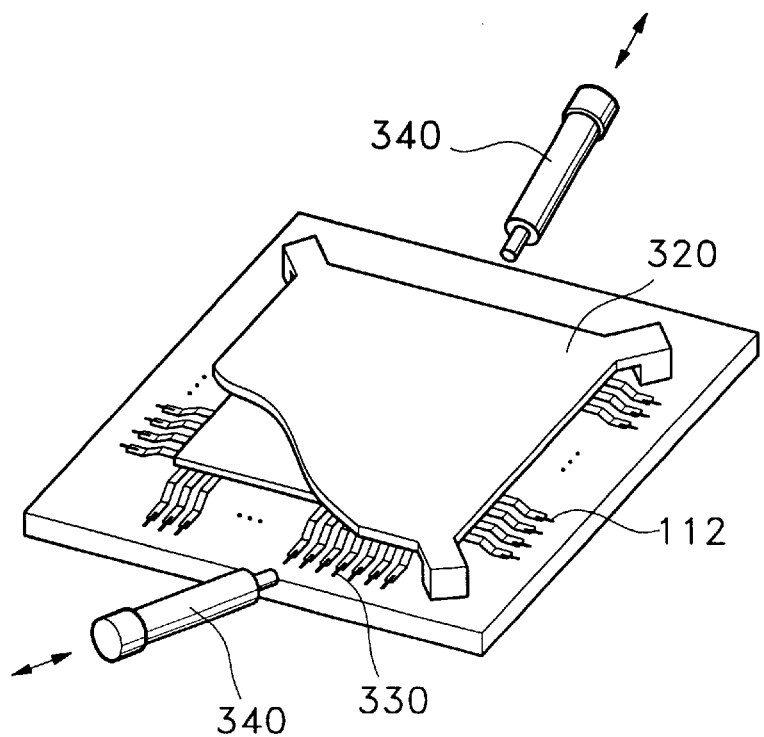

Referring to FIGS. 2, 4A, and 4B, a method for mounting integrated circuits on a printed circuit board according to the present invention will be described hereinafter. FIG. 2 is a flowchart of a method for mounting integrated circuits on a printed circuit board, in accordance with the principles of the present invention. FIGS. 4A and 4B illustrate the method for mounting integrated circuits on a printed circuit board, in accordance with the principles of the present invention.

Turn now to FIG. 2, which is a flowchart of a method for mounting integrated circuits on a printed circuit board, in accordance with the principles of the present invention. At step 100, a printed circuit board 300, shown in FIG. 4A, is loaded. At step 110, contaminating particles attached to the printed circuit board 300 transferred from a previous process are removed by an air gun. Preferably, the printed circuit board 300 may be an array of four printed circuit boards 300.

The printed circuit board 300 is loaded on a guide rail and transferred to a position for applying a conductive bond 350. At step 120, the conductive bond 350 is applied to a portion of the printed circuit board 300 on which a semiconductor chip 310 is to be mounted by a dispenser as shown FIG. 4A. Preferably, the portion of the printed circuit board 300 applied with the conductive bond 350 is approximately 60% of the area of the semiconductor chip 310 to be mounted on the printed circuit board 300.

A flux stamp (not shown) is immersed into a flux tank containing flux and the flux is applied to the bottom of the flux stamp. The flux stamp is then located over the integrated circuit lead pattern 112 on the printed circuit board 300. The flux is stamped on the printed circuit board 300 by pressing the printed circuit board 300 under the flux stamp. At step 130, as a result, portions of the integrated circuit lead pattern 112 that will be soldered with leads 360 of the integrated circuit is applied with the flux at a time. The flux having a high adhesion serves as a lubricant for easy soldering in the subsequent process, that is, a soldering process. After the integrated circuit lead pattern on the printed circuit board 300 of a printed circuit board array is applied with the flux by the flux stamp, integrated circuit lead patterns on the remaining three printed circuit boards of the printed circuit board array are applied with the flux by the flux stamp in the same manner.

At step 200, an tape carrier package type integrated circuit is loaded. At step S210, the loaded integrated circuit in a plastic carrier is cut having a predetermined size corresponding to the lead pattern 112 on the printed circuit board 300 and leads 360 of the integrated circuit are molded.

The integrated circuit including the leads 360 is suck-in and adsorbed on a holding block 320 installed in the mounting portion 40, shown in FIG. 1, and the integrated circuit is moved onto the lead pattern 112 on the printed circuit board 300 by the holding block 320. At this time, the state that the leads 360 of the integrated circuit are aligned with the integrated circuit lead pattern 112 on the printed circuit board 300 can be visibly checked through a monitor by a vision system installed in the mounting portion 40. At step 140, checking an image of a camera, the vision system aligns the leads 360 of the integrated circuit with the integrated circuit lead pattern 112 on the printed circuit board 300. The lead patterns of the other three printed circuit boards 300 of the printed circuit board array are also aligned with the leads of the other integrated circuits in the same manner.

At step 150 of FIG. 2, air nozzles 340 spray a hot air having a high temperature to a portion of the leads 112 of the integrated circuit aligned on the printed circuit board 300 for several seconds so that the leads 112 are preliminarily soldered on the printed circuit board 300. Accordingly, the integrated circuit aligned with the integrated circuit lead pattern 112 on the printed circuit board 300 can be protected from being disordered while the printed circuit board 300 is transferred to the soldering apparatus.

Figure 3:
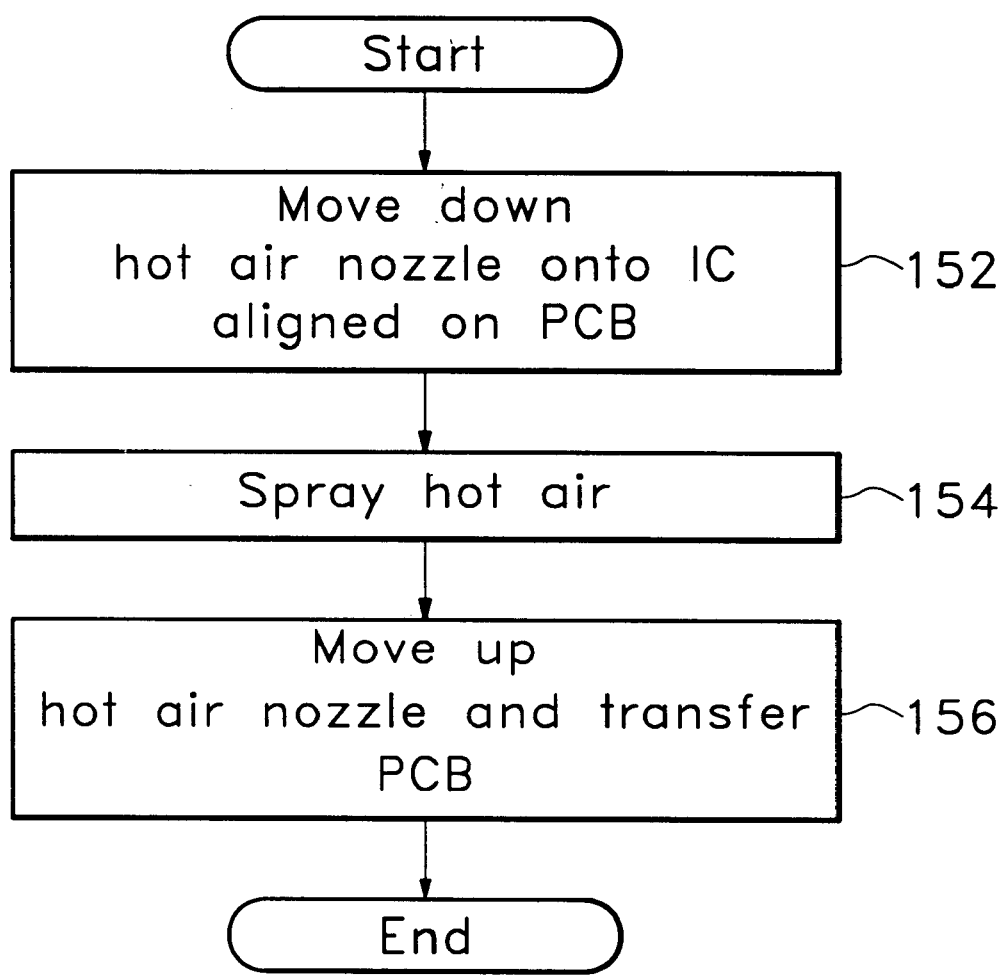
FIG. 3 is a flowchart of a preliminarily soldering step 150 of FIG. 2, in accordance with the principles of the present invention.

Turn now to FIG. 3, which is a flowchart of a preliminarily soldering step 150 of FIG. 2, in accordance with the principles of the present invention. The substeps of the preliminarily soldering step 150 of FIG. 2 will be described in detail with reference to FIG. 3.

At step 152 of FIG. 3, the integrated circuit including the leads 360 is aligned with the lead pattern 112 on the printed circuit board 300 in an aligning equipment and transferred to a predetermined position. A hot air nozzle 340 for spraying a high temperature air is moved down over the leads 360 of the integrated circuit. At step 154, the hot air nozzle 340 is then turned on and the hot air having a predetermined temperature is sprayed onto the leads 360 of the integrated circuit for a predetermined amount of time. Accordingly, the lead pattern 112 of the integrated circuit on the printed circuit board 300 is soldered with the leads 360 of the integrated circuit by the hot air. Preferably, the predetermined temperature is 613 degrees Celsius and the predetermined amount of time is three seconds. In addition, the flux having a high adhesion that is applied to the lead pattern 112 serves as a lubricant for easy soldering. After a predetermined amount of time, the hot air spraying is stopped. At step 156, a heater is then turned off and the hot air nozzle 340 is moved up. This corresponds to the completion of the preliminarily soldering step 150.

After the preliminarily soldering step 150, the printed circuit board 300 is transferred to the soldering apparatus completely soldering the leads of the integrated circuit to the integrated circuit lead pattern. At step 160 of FIG. 2, the integrated circuit that has been preliminarily soldered at step 150 is completely soldered. The integrated circuit lead pattern 112 on the printed circuit board 300 is pulled tight by the holding block 320. The holding block 320 covers the integrated circuit, and accordingly only the leads of the integrated circuit are exposed out of the holding block 320 so that the holding block 320 protects the semiconductor chip of the integrated circuit during the soldering step 160. A xenon light beam is applied to the leads of the integrated circuit fixed by the holding block 320 on the printed circuit board 300 for a predetermined amount of time. As a result, the leads 360 of the integrated circuit are completely soldered with the integrated circuit lead pattern 112 on the printed circuit board 300. The integrated circuit is soldered on the printed circuit board by the light beam of 300 degrees Celsius that is supplied in spaced apart relation from the integrated circuit. Accordingly, it is possible to achieve evenly soldering integrated circuits on the printed circuit board. This may reduce poorly soldered integrated circuits on the printed circuit board 300.

At step 170, the printed circuit board 300 and the holding block 320 heated to a high temperature through the soldering step are cooled. The holding block 320 is then lifted from the printed circuit board 300 by a vacuum pump (not shown) and moved to a predetermined position.

The light beam soldering step 160 and the cooling step 170 are repeated until the other integrated circuits on the printed circuit board 300 are completely soldered. At step 180, the printed circuit board 300 including the integrated circuits completely soldered thereon is unloaded and transferred to a subsequent process.

As aforementioned, the integrated circuits aligned on the printed circuit board are preliminarily soldered and therefore the integrated circuits aligned on the printed circuit board can be prevented from being disordered while the printed circuit board is transferred to the soldering apparatus. This may result in an enhanced soldering efficiency and productivity.

The foregoing paragraphs describe the details of a method for mounting integrated circuits (ICs) on a printed circuit board (PCB) and, more particularly, to a method for mounting tape carrier package (TCP) type integrated circuits on a printed circuit board wherein the tape carrier package type integrated circuits are preliminarily soldered on the printed circuit board in an aligning process before the printed circuit board is transferred to a soldering process.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A method of mounting an integrated circuit on a printed circuit board, comprising the steps of:

aligning an integrated circuit with a lead pattern on a printed circuit board, the integrated circuit having a total quantity of leads, said total quantity of leads including a first plurality of leads and a second plurality of leads;

first soldering the second plurality of leads with the lead pattern, said first soldering corresponding to a preliminary soldering, said first soldering being performed by a hot gas nozzle, said first soldering holding the integrated circuit and the printed circuit board in said alignment; and after said first soldering, second soldering the first plurality of leads with the lead pattern by applying a beam of energy.

2. The method of claim 1, wherein said first soldering step comprises the substeps of:

moving said hot gas nozzle toward the second plurality of leads of the integrated circuit aligned on the printed circuit board;

spraying hot gas having a predetermined temperature from said hot gas nozzle to the second plurality of leads for a predetermined quantity of time; and stopping said spraying of hot gas and moving said hot gas nozzle away from the second plurality of leads.

3. The method of claim 2, further comprising applying a flux to the lead pattern.

4. The method of claim 1, further comprising:

after said first soldering and before said second soldering, moving the printed circuit board.

5. The method of claim 2, the predetermined quantity of time substantially corresponding to three seconds, the predetermined temperature substantially corresponding to 613 degrees Celsius.

6. The method of claim 1, the lead pattern corresponding to a copper foil etched to form a contact pattern.

7. The method of claim 6, a substrate of polyimide film being laminated to the copper foil.

8. A method of mounting an integrated circuit on a printed circuit board, comprising the steps of:

moving a printed circuit board to a processing position;

blowing the printed circuit board with gas to remove contamination from the printed circuit board;

applying a flux to an integrated circuit lead pattern on the printed circuit board;

aligning an integrated circuit and the integrated circuit lead pattern of the printed circuit board, the integrated circuit having a first plurality of leads and a second plurality of leads;

after the lead pattern and the integrated circuit are aligned, first soldering the second plurality of leads of the integrated circuit with said integrated circuit lead pattern on the printed circuit board corresponding to the second plurality of leads, said first soldering corresponding to a preliminary soldering, said preliminary soldering being performed by a nozzle unit spraying hot gas, said first soldering holding the integrated circuit and the printed circuit board in said alignment;

after said first soldering, second soldering the first plurality of leads with said integrated circuit lead pattern on the printed circuit board by applying a beam of energy from a soldering unit, said second soldering corresponding to a complete soldering;

cooling the printed circuit board; and moving the printed circuit board from the processing position.

9. The method of claim 8, wherein said first soldering step comprises the substeps of:

moving said nozzle unit toward the second plurality of leads of the integrated circuit aligned on the printed circuit board;

spraying said hot gas having a predetermined temperature from said nozzle unit to the second plurality of leads for a predetermined quantity of time; and stopping said spraying of hot gas and moving said nozzle unit away from the second plurality of leads.

10. The method of claim 9, further comprising:

after said first soldering and before said second soldering, moving the printed circuit board to said soldering unit.

11. The method of claim 9, wherein said predetermined temperature is 613 degrees Celsius.

12. The method of claim 9, wherein said predetermined quantity of time is three seconds.

13. The method of claim 8, wherein said integrated circuit lead pattern corresponds to a copper foil etched to form a contact pattern.

14. The method of claim 13, wherein said copper foil further comprises a substrate of polyimide film laminated to said copper foil.

15. The method of claim 8, wherein said beam of energy corresponds to a xenon beam of energy.

16. The method of claim 1, the second plurality of leads corresponding to a number of leads less than the total quantity of leads.

17. The method of claim 1, the first plurality of leads corresponding to a group of leads not including every one of the second plurality of leads.

18. The method of claim 1, the first plurality of leads corresponding to the total quantity of leads, the second plurality of leads corresponding to a number of leads less than the total quantity of leads.

* * * * *